United States Patent
Li et al.

(10) Patent No.: US 9,468,112 B2
(45) Date of Patent: Oct. 11, 2016

(54) DISPLAY DEVICE WITH NARROW FRAME

(71) Applicant: SHENZHEN CHINA STAR OPTOELECTRONICS TECHNOLOGY CO., LTD., Shenzhen, Guangdong (CN)

(72) Inventors: Dehua Li, Shenzhen (CN); Guofu Tang, Shenzhen (CN); Shih Hsiang Chen, Shenzhen (CN); Yuchun Hsiao, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 156 days.

(21) Appl. No.: 14/240,378

(22) PCT Filed: Jan. 24, 2014

(86) PCT No.: PCT/CN2014/071386
§ 371 (c)(1),
(2) Date: Feb. 22, 2014

(87) PCT Pub. No.: WO2015/018192
PCT Pub. Date: Feb. 12, 2015

(65) Prior Publication Data
US 2015/0043179 A1    Feb. 12, 2015

(30) Foreign Application Priority Data

Aug. 9, 2013  (CN) .......................... 2013 1 0349488

(51) Int. Cl.
*G06F 1/16* (2006.01)
*H05K 5/02* (2006.01)
(Continued)

(52) U.S. Cl.
CPC ...................................... *H05K 5/02* (2013.01)

(58) Field of Classification Search
CPC .................. G06F 1/16; G06F 1/1601–1/1611; G06F 1/1613–1/1698; G06F 1/18–1/189; H05K 5/00–5/069; H05K 7/00–7/186
USPC ............ 361/679.01–679.45, 679.55–679.61, 361/724–821; 455/575.1–575.9; 349/56–60; 312/223.1–223.3
See application file for complete search history.

(56) References Cited

U.S. PATENT DOCUMENTS

2005/0073623 A1* 4/2005 Tsuo ................. G02F 1/133308
349/58
2006/0244721 A1* 11/2006 Wang .................... G06F 1/1601
345/156
(Continued)

FOREIGN PATENT DOCUMENTS

CN      101359119 A     2/2009
CN      102879927 A     1/2013
(Continued)

OTHER PUBLICATIONS

International Search Report mailed May 26, 2014, issued to International Application No. PCT/CN2014/071386.

*Primary Examiner* — Anthony Haughton
*Assistant Examiner* — Razmeen Gafur
(74) *Attorney, Agent, or Firm* — Stein IP, LLC

(57) ABSTRACT

The present disclosure relates to the technical field of display, and particularly relates to a display with an improvide4d frame structure. The present disclosure proposes a narrow frame display, including a display panel having a protruding portion on at least one side edge thereof, a back plate located on one side of the display panel, and a frame including a plate body with a through slot. The frame is arranged vertical to the display panel and fixed on the back plate, and the protruding portion is inserted into the through slot. With this structure of the frame, a hook member used in the prior art can be omitted, so that the shadows caused by shielding of the hook member would be generated no longer. Therefore, the display of the present disclosure can effectively eliminate shadows caused by shielding of the hook member in the prior art. Meanwhile, it is unnecessary to occupy the space of the rear side of the display panel, so that the frame of the display can be further narrowed.

8 Claims, 6 Drawing Sheets

(51) Int. Cl.
*H05K 5/00* (2006.01)
*H05K 7/00* (2006.01)

(56) References Cited

U.S. PATENT DOCUMENTS

| | | | | |
|---|---|---|---|---|
| 2007/0236873 A1* | 10/2007 | Yukawa | ................ | G06F 1/16 361/679.22 |
| 2008/0137272 A1* | 6/2008 | Cheng | ............ | G02F 1/133308 361/679.01 |
| 2008/0144265 A1* | 6/2008 | Aoki | ................ | G06F 1/1601 361/679.04 |
| 2008/0218954 A1* | 9/2008 | Kawano | ............ | G02F 1/133308 361/679.02 |
| 2009/0237324 A1* | 9/2009 | Oh | .................... | G06F 1/1601 345/1.1 |
| 2010/0079698 A1* | 4/2010 | Matsumoto | ......... | H04M 1/0266 349/58 |
| 2010/0238128 A1* | 9/2010 | Yu | .................... | G06F 3/0428 345/173 |
| 2010/0309619 A1* | 12/2010 | Cheng | ................ | G06F 1/1601 361/679.27 |
| 2011/0116217 A1* | 5/2011 | Lee | ................ | H05K 5/0217 361/679.01 |
| 2011/0134057 A1* | 6/2011 | Kubo | ................ | G02F 1/1306 345/173 |
| 2011/0148784 A1* | 6/2011 | Lee | ................ | G06F 1/1601 345/173 |
| 2011/0285652 A1* | 11/2011 | Imamura | ............ | G06F 1/1616 345/173 |
| 2012/0033141 A1* | 2/2012 | Nonaka | ................ | G06F 1/1601 348/836 |
| 2012/0044650 A1* | 2/2012 | Kim | ................ | G02F 1/133308 361/718 |
| 2012/0147541 A1* | 6/2012 | Chen | ................ | G06F 1/1637 361/679.21 |
| 2012/0162564 A1* | 6/2012 | Kim | ................ | G06F 1/1601 349/58 |
| 2012/0162952 A1* | 6/2012 | Tamura | ................ | H04N 5/64 361/807 |
| 2012/0176737 A1* | 7/2012 | Kim | ................ | G02F 1/133308 361/679.01 |
| 2012/0200767 A1* | 8/2012 | Park | ................ | G06F 1/1686 348/373 |
| 2012/0210621 A1* | 8/2012 | Huang | ............ | H04M 1/0266 40/745 |
| 2012/0224338 A1* | 9/2012 | Park | ................ | G02F 1/133308 361/752 |
| 2012/0249892 A1* | 10/2012 | Kono | ................ | G06F 1/1601 348/794 |
| 2012/0307463 A1* | 12/2012 | Yamashita | ............ | H01J 11/34 361/752 |

FOREIGN PATENT DOCUMENTS

| | | |
|---|---|---|
| CN | 103091875 A | 5/2013 |
| CN | 202941067 U | 5/2013 |
| CN | 103454789 A | 12/2013 |
| JP | 2005-242047 A | 9/2005 |
| JP | 2007-78926 A | 3/2007 |
| JP | 2009-86115 A | 4/2009 |

\* cited by examiner

DISPLAY DEVICE WITH NARROW FRAME

FIELD OF THE INVENTION

The present disclosure relates to the technical field of display, and particularly relates to a display with a relatively narrow frame structure.

BACKGROUND OF THE INVENTION

A "narrow frame" of a television indicates that no obvious frame is used to cover a display panel of the television, so that the appearance of the television is simple and fashionable. With the simple and fashionable appearance, the narrow frame television becomes a development trend of liquid crystal televisions.

For the narrow frame structure used in the prior art, generally no obvious frame is arranged on three sides of the television. This is achieved dependent on a Gate On Array (GOA) technology, namely, a gate circuit is directly formed on an array substrate of the display panel, so that a traditional external Gate IC can be avoided. In addition, no additional chip on film (COF) is necessary for circuit wiring, so that there is no need to provide a space on the side of the television for disposing the COF. In this manner, a narrow frame display can be possibly obtained.

In the prior art, because the side of an array layer of a display panel should be used for circuit wiring so that a display function cannot be implemented here, it is necessary to provide a black mask (BM) between a color filter (CF) substrate and an array substrate, for shielding light, circuits and the like. With the development of technology, a side circuit can be made as more and more elaborate, and thus the space required at the side of the array substrate is narrower and narrower, and even may be eliminated. In this way, a real narrow frame display (in which a BM area exists no longer) can be realized, and displayed pictures can be maximized.

In a method for fixing the display panel through a narrow frame module in the prior art, fasteners, a framing member and the like are generally bonded on the rear side of the display panel, and then the display panel is fixed on a back plate of the module. However, when the BM of the display panel is narrowed to e.g. 3 mm or even smaller, the above-mentioned method is no longer applicable. This is because the fasteners or framing member for fixing the display panel would extend beyond the range of the viewing line of the display panel, and thus a user could observe the shadows caused by the fasteners after the display panel is turned on.

FIG. 1 shows a narrow frame display according to the prior art. The display includes a liquid crystal display panel 1, and a hook 3 connected with the liquid crystal display panel 1 at one end thereof with glue 2. The other end of the hook 3 is fixed on a back plate 5 through a screw 4. In this structure, a certain space should be occupied on the rear side of the display panel. When the BM area of the display panel is made narrower and narrower, this method is no longer applicable since the hook 3 would block the viewing angle.

SUMMARY OF THE INVENTION

To solve the above-mentioned problem of shadows caused by the shielding from a hook member in the prior art, the present disclosure provides a display with an improved frame structure.

The first embodiment of the present disclosure proposes a narrow frame display, including a display panel having a protruding portion on at least one side edge thereof, a back plate located on one side of the display panel, and a frame including a plate body with a through slot. The frame is arranged vertical to the display panel and fixed on the back plate, and the protruding portion is inserted into the through slot. With this structure of the frame, a hook member used in the prior art can be omitted, so that the shadows caused by shielding of the hook member would be generated no longer.

In a second embodiment improved based on the first embodiment, the protruding portion includes a block member bonded on the side edge of the display panel with adhesive. Through connecting the block member with adhesive, the position of the block member can be flexibly selected according to the structural design.

In a third embodiment improved based on to the first embodiment, the protruding portion includes a projection extending from the side edge of the display panel in an integral manner. With such a structure, the display can be produced at low cost in a convenient manner.

In a fourth embodiment improved based on the third embodiment, the projection is merely located on a color filter substrate of the display panel. In a fifth embodiment improved based on the third embodiment, the projection is merely located on an array substrate of the display panel. Thus, materials can be saved, and the cost can be reduced.

In a sixth embodiment improved based on any one of the first through the fifth embodiments, the frame is fixed on the back plate through a screw.

In a seventh embodiment improved based on any one of the first through the fifth embodiments, the frame is fixed on the back plate through a hook member.

In an eighth embodiment improved based on any one of the first through the seventh embodiments, the protruding portion is provided at each of two opposite side edges of the display panel, and the display includes two frames. Thus, the display panel can be securingly positioned in each direction.

In a ninth embodiment improved based on any one of the first through the eighth embodiments, three to six protruding portions are provided at one and the same side edge of the display panel. With three to six protruding portions, a firm fixation can be realized with less material and few procedures.

In a tenth embodiment improved based on any one of the first through the ninth embodiments, the protruding portion extends longitudinally along the side edge of the display panel, and has a cross section of oblong or square.

In the display according to the present disclosure and variants thereof, shadows caused by shielding of the hook member at the frame of the display in the prior art can be effectively eliminated. Meanwhile, it is unnecessary to occupy the space of the rear side of the display panel, so that the frame of the display can be further narrowed.

The above-mentioned technical features may be combined in various appropriate manners or substituted by equivalent technical features, as long as the objective of the present disclosure can be fulfilled.

BRIEF DESCRIPTION OF THE DRAWINGS

The present disclosure will be described in more detail below based on nonfinite examples with reference to the accompanying drawings. In the drawings.

Figure 1:
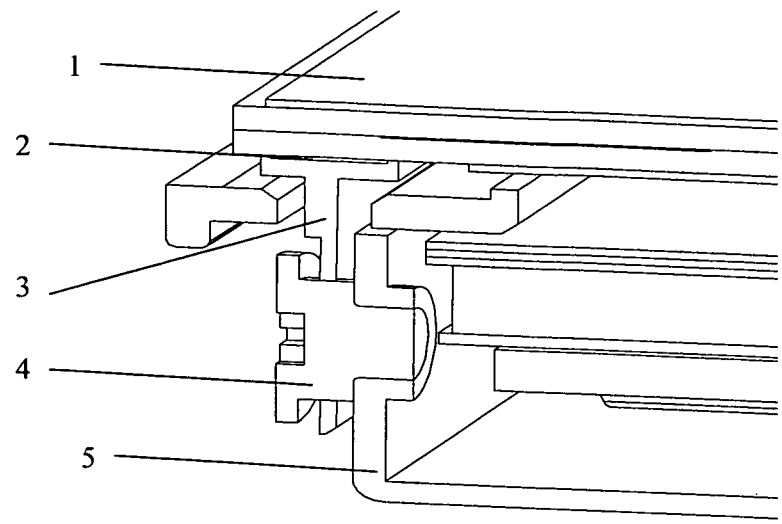
FIG. 1 shows a display in the prior art.

In the drawings, the same components are indicated by the same reference signs. The accompanying drawings are not drawn in an actual scale.

DETAILED DESCRIPTION OF THE EMBODIMENTS

The present disclosure will be illustrated in detail below with reference to the accompanying drawings.

Figure 2:
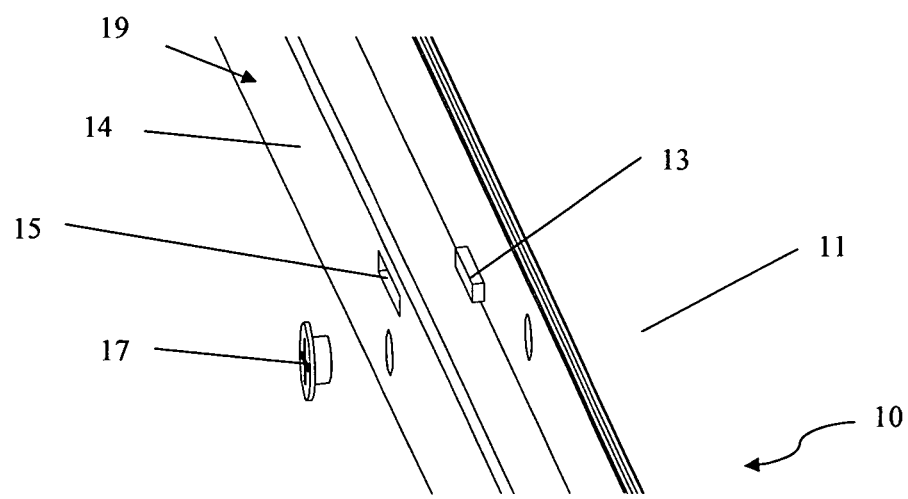
FIG. 2 schematically shows a display according to a first embodiment of the present disclosure in an exploded state.
Figure 3:
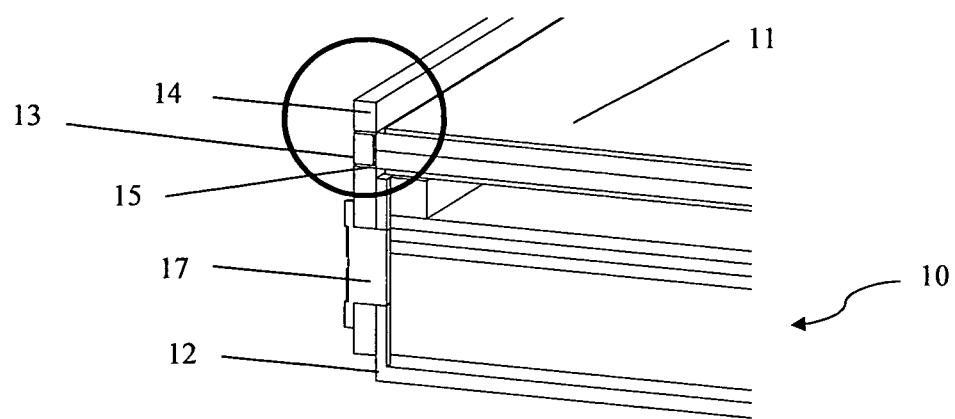
FIG. 3 schematically shows the display according to the first embodiment of the present disclosure in an assembled state.
Figure 4:
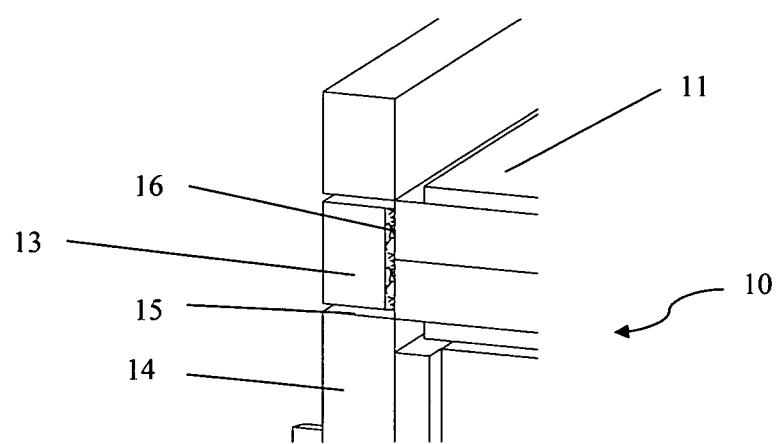
FIG. 4 shows the details of the circled portion in FIG. 3.

FIGS. 2 to 5 show a display 10 according to a first embodiment of the present disclosure. In these drawings, FIG. 2 schematically shows the display 10 in an exploded state, and FIGS. 3 and 4 schematically shows the display 10 in an assembled state, wherein FIG. 4 shows the details of the circled portion in FIG. 3.

The display 10 according to the present disclosure includes a plate-like frame 14 functioning as a support. The plate-like frame 14 has a plate body 19, and a through slot 15 extending through the plate body 19 along its thickness direction.

The display 10 further includes a display panel 11 to be assembled together with the frame 14. The display panel 11 may be a liquid crystal display panel, and includes a color filter substrate and an array substrate. In the assembled state, the frame 14 is arranged as being approximately vertical to the plane of the display panel 11, and the through slot 15 of the frame 14 extends longitudinally along the side edge of the display panel 11.

The display 10 further includes a connecting block 13 arranged at the side edge of the display panel 11. The connecting block 13 may be bonded on the side edge of the display panel 11 through adhesive 16. The connecting block 13 may be in form of a strip structure extending longitudinally along the side edge of the display panel 11, and can have a cross section of square or oblong. In an example, three to six connecting blocks 13 may be arranged on the same side edge of the display panel 11. In the assembled state, the connecting blocks 13 are each located in a corresponding through slot 15. Preferably, the shape of the connecting block 13 can match with the shape of the through slot 15.

The frame 14 can be fixed on a back plate 12 of the display 10 located on one side of the display panel 11 through a screw 17. In other examples, the frame 14 can also be fixed on the back plate 12 through a hook member.

Figure 5:
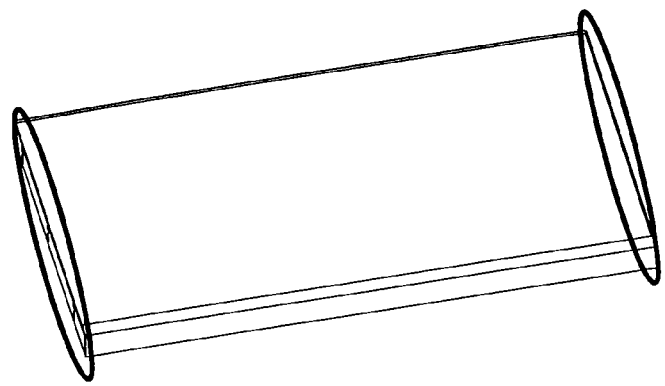
FIG. 5 shows a preferred embodiment of the display according to the first embodiment of the present disclosure.

With reference to FIG. 5, such a structure can be provided at each of two opposite side edges of the display panel 11.

In this manner, the degree of freedom of the display panel 11 in each direction can be restricted, so that the display panel 11 can be secured. With this structure, it is unnecessary to occupy the space at the rear side of the display panel 11, thus enabling the visible frame of a television can be made narrower, without shadows which may affect the visual effect.

FIGS. 6 to 11 show a display 10' according to a second embodiment of the present disclosure.

Figure 6:
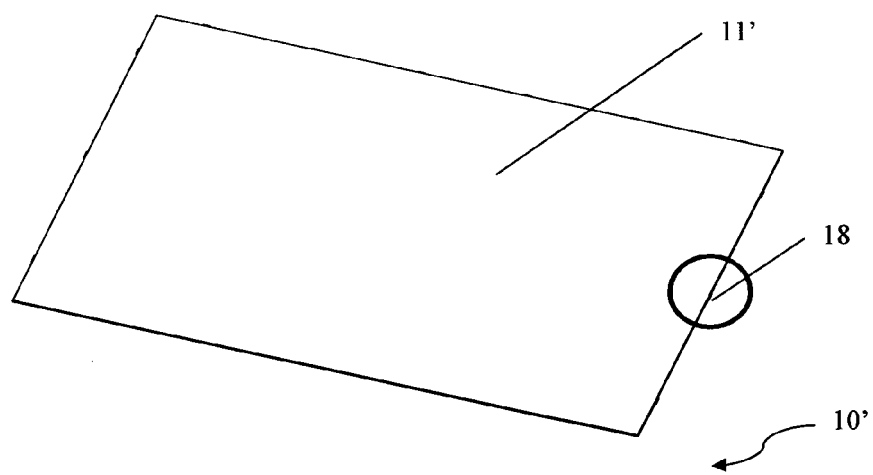
FIG. 6 partially shows the structure of a display according to a second embodiment of the present disclosure.

FIG. 6 shows a display panel 11' of the display 10'. The display panel 11' includes a color filter substrate and an array substrate. A projection 18 protruding outwardly is formed at the side edge of the display panel 11'. The projection 18 extends from the display panel 11' and is integrated therewith. The projection 18 extends longitudinally along the edge of the display panel 11', and can have a cross section of square or oblong. As shown in FIG. 6, three to six projections 18 can be provided at one and the same edge of the display panel 11'.

Figure 7:
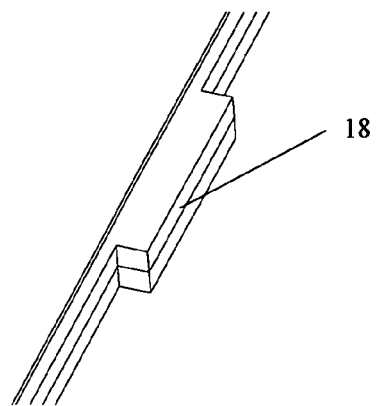
FIG. 7 shows the details of the circled portion in FIG. 6.

FIG. 7 shows the details of the circled portion in FIG. 6. In the example shown in FIG. 7, both the color filter substrate and the array substrate of the display panel 11' are provided with a corresponding protruding portion. The two protruding portions form the projection 18 together.

Figure 8:
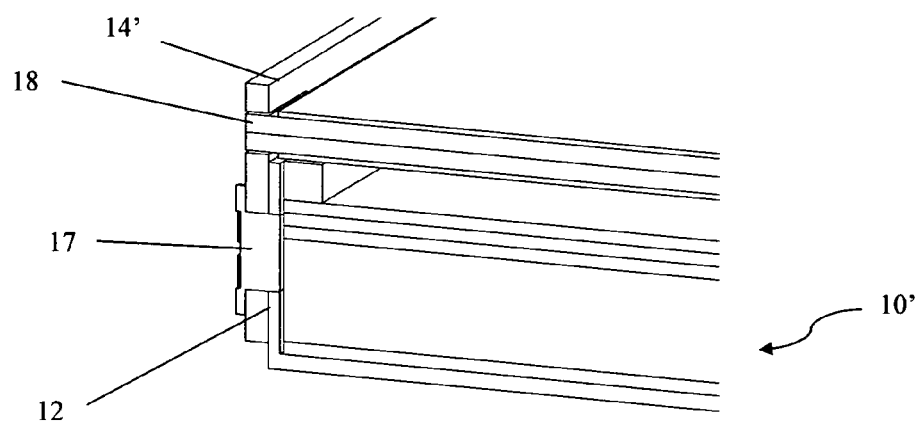
FIG. 8 schematically shows the display according to the second embodiment of the present disclosure in an assembled state.
Figure 9:
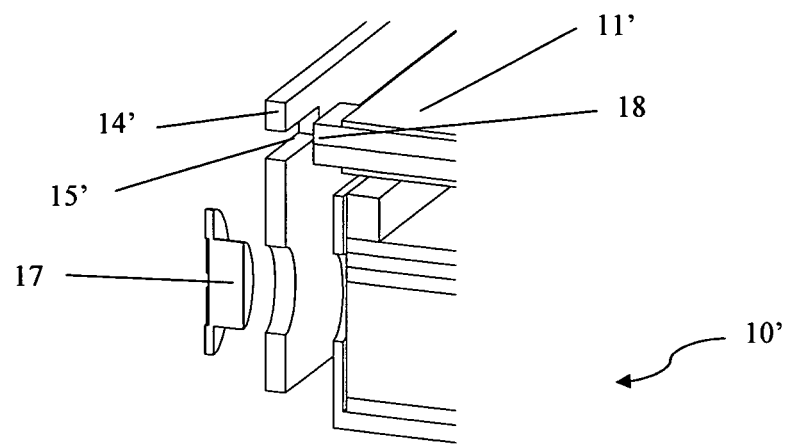
FIG. 9 schematically shows the display according to a first embodiment of the present disclosure in an exploded state.

FIG. 8 schematically shows the display 10' in an assembled state, and FIG. 9 schematically shows the display 10 in an exploded state.

With reference to FIG. 8 and FIG. 9, the display 10' further includes a plate-like frame 14' functioning as a support. When the display 10' is manufactured, the display panel 11' and the frame 14' are assembled together, so that the frame 14' is arranged as being approximately vertical to the plane of the display panel 11'. The frame 14' is provided with a through slot 15' that can form a shape fit with the projection 18 at the side edge of the display panel 11'. When the display panel 11' and the frame 14' are assembled together, the projection 18 can be inserted into the through slot 15'. Then, the frame 14' can fixed on the back plate 12 of the display 10' located on one side of the display panel 11', which can be achieved by the screws 17 or the like.

Figure 10:
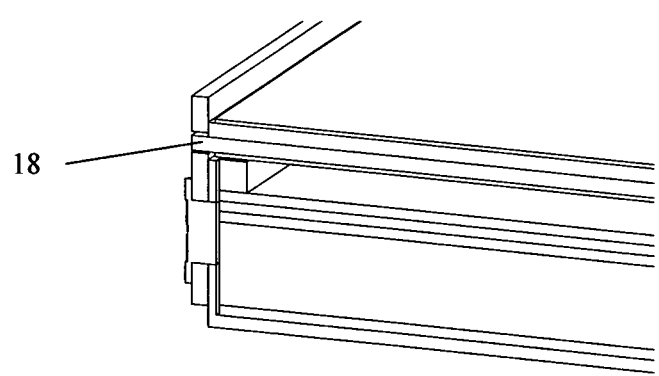
FIG. 10 shows a preferred embodiment of the display according to the second embodiment of the present disclosure.
Figure 11:
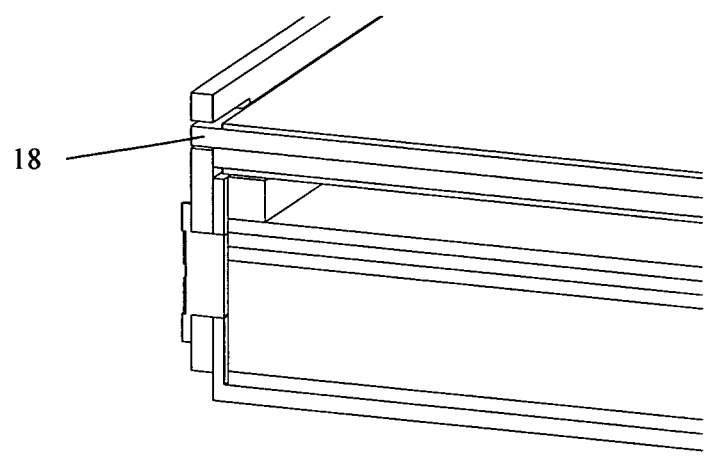
FIG. 11 shows another preferred embodiment of the display according to the second embodiment of the present disclosure.

FIG. 10 and FIG. 11 show two options obtained through modifying the display 10' according to the second embodiment of the present disclosure respectively.

In FIG. 10, the projection 18 is merely arranged on the array substrate of the display panel 11' of the display 10'. In contrast, in FIG. 11, the projection 18 is merely arranged on the color filter substrate of the display panel 11' of the display 10'. According to the options provided in FIG. 10 and FIG. 11, the difficulty of the manufacturing process is relatively low, and materials can be saved.

According to the structure and method provided in the present disclosure, it is unnecessary to occupy the space of the rear side of the display panel, and the visible frame of the television can be narrower.

Although the present disclosure has been described with reference to the preferred embodiments, various modifications could be made to the present disclosure without departing from the scope of the present disclosure and components in the present disclosure could be substituted by equivalents. The present disclosure is not limited to the specific embodiments disclosed in the description, but includes all technical solutions falling into the scope of the claims.

The invention claimed is:

1. A narrow frame display, including:
   a display panel, having a protruding portion on at least one side edge thereof;

a back plate, located on one side of the display panel; and
a frame, including a plate body with a through slot,
wherein the frame is arranged vertical to the display panel and fixed on the back plate,
the protruding portion is a projection extending from the side edge of the display panel in an integral manner, and the display panel is fixed to the frame through inserting the projection into the through slot.

2. The display according to claim 1, wherein the projection is located on a color filter substrate of the display panel.

3. The display according to claim 1, wherein the projection is located on an array substrate of the display panel.

4. The display according to claim 1, wherein the frame is fixed on the back plate with a screw.

5. The display according to claim 1, wherein the frame is fixed on the back plate with a hook member.

6. The display according to claim 1, wherein the protruding portion is plural in number respectively provided at each of two opposite side edges of the display panel, and the display includes two said frames.

7. The display according to claim 1, wherein three to six protruding portions are provided at one and the same side edge of the display panel.

8. The display according to claim 1, wherein the protruding portion extends longitudinally along the side edge of the display panel, and has a cross section of oblong or square.

* * * * *